US012649275B2

(12) United States Patent
Yang et al.

(10) Patent No.: US 12,649,275 B2
(45) Date of Patent: Jun. 9, 2026

(54) 3D PRINTING-ASSISTED MULTI-SCALE METAL THREE-DIMENSIONAL SURFACE STRUCTURE PREPARATION METHOD AND PRODUCT

(71) Applicants: HUAZHONG UNIVERSITY OF SCIENCE AND TECHNOLOGY, Hubei (CN); DALIAN UNIVERSITY OF TECHNOLOGY, Liaoning (CN)

(72) Inventors: Ronggui Yang, Hubei (CN); Yifan Lei, Hubei (CN); Yongyan Hu, Hubei (CN); Xiuliang Liu, Hubei (CN); Rongfu Wen, Liaoning (CN)

(73) Assignees: HUAZHONG UNIVERSITY OF SCIENCE AND TECHNOLOGY, Hubei (CN); DALIAN UNIVERSITY OF TECHNOLOGY, Liaoning (CN)

( * ) Notice: Subject to any disclaimer, the term of this patent is extended or adjusted under 35 U.S.C. 154(b) by 198 days.

(21) Appl. No.: 18/578,009

(22) PCT Filed: May 9, 2023

(86) PCT No.: PCT/CN2023/092861
§ 371 (c)(1),
(2) Date: Jan. 10, 2024

(87) PCT Pub. No.: WO2024/087575
PCT Pub. Date: May 2, 2024

(65) Prior Publication Data
US 2025/0091288 A1 Mar. 20, 2025

(30) Foreign Application Priority Data
Oct. 27, 2022 (CN) ......................... 202211328386.X

(51) Int. Cl.
*B29C 64/124* (2017.01)
*B33Y 10/00* (2015.01)
(Continued)

(52) U.S. Cl.
CPC ............ *B29C 64/124* (2017.08); *C23C 16/04* (2013.01); *B33Y 10/00* (2014.12); *B33Y 80/00* (2014.12)

(58) Field of Classification Search
CPC ..... B29C 64/124; B29C 64/393; C23C 16/04; C23C 18/1657; B33Y 10/00; B33Y 80/00;
(Continued)

(56) References Cited

U.S. PATENT DOCUMENTS

2025/0040060 A1* 1/2025 Cai ........................ B33Y 80/00

FOREIGN PATENT DOCUMENTS

CN 106903310 6/2017
CN 108085725 5/2018
(Continued)

OTHER PUBLICATIONS

English Machine translation, CN108085725A, obtained Nov. 18, 2025, Espacenet.com (Year: 2025).*
(Continued)

*Primary Examiner* — Michael M. Robinson
(74) *Attorney, Agent, or Firm* — JCIPRNET

(57) ABSTRACT

The disclosure relates to the field of micro-nano structure-enhanced heat transfer surfaces and provides a 3D printing-assisted multi-scale metal three-dimensional surface structure preparation method and product. The method includes the following steps. A micron-level and highly-precise three-dimensional structure mask is prepared through a 3D printing technology, the hollow portion of mask is matched with the target structure model. Material conversion is performed
(Continued)

Preparing a micron-level and highly-precise three-dimensional structure photomask through a 3D printing technology to improve precision of a metal structure, wherein the three-dimensional structure photomask comprises a hollow portion and a body portion, and the hollow portion is matched with a three-dimensional structure model ⟋ S101

Performing material conversion on a metal matrix fixed with the three-dimensional structure photomask and obtaining a target metal, wherein the metal matrix is machined first, and a surface of the target metal has a three-dimensional structure matched with the three-dimensional structure model ⟋ S102 on a metal matrix fixed with the mask, and a target metal is obtained. Herein, the metal matrix is machined first, and a surface of the target metal is matched with the structure model. In the preparation method provided in the disclosed embodiment, the precision of the metal structure is improved by improving the precision of the template. The multi-scale and multi-material heat exchange structure with micron-level precision and a complex structure is prepared on the metal surface to improve the heat exchange efficiency of phase change.

7 Claims, 12 Drawing Sheets

(51) Int. Cl.
     *B33Y 80/00*        (2015.01)
     *C23C 16/04*        (2006.01)
(58) Field of Classification Search
     CPC ....... B33Y 40/20; B33Y 50/02; G03F 7/0037;
                 G03F 7/2053; G03F 7/12; C25D 1/02;
                 C25D 1/08; F28D 20/02; F28D 21/00;
                 Y02P 10/25
     See application file for complete search history.

(56)                References Cited

FOREIGN PATENT DOCUMENTS

| CN | 108166023 | 6/2018 |
|----|-----------|--------|
| CN | 109895382 | 6/2019 |
| CN | 113479313 | 10/2021 |
| CN | 114561672 | 5/2022 |
| CN | 114888304 | 8/2022 |
| CN | 115106537 | 9/2022 |
| CN | 115786995 | 3/2023 |
| GB | 2508378 | 6/2014 |

OTHER PUBLICATIONS

English Machine translation, CN113479313A, obtained Nov. 18, 2025, Espacenet.com (Year: 2025).*
"International Search Report (Form PCT/ISA/210) of PCT/CN2023/092861," mailed on Aug. 24, 2023, with English translation thereof, pp. 1-4.
"Written Opinion of the International Searching Authority (Form PCT/ISA/237) of PCT/CN2023/092861," mailed on Aug. 24, 2023, with English translation thereof, pp. 1-5.

* cited by examiner

| | |
|---|---|
| Preparing a micron-level and highly-precise three-dimensional structure photomask through a 3D printing technology to improve precision of a metal structure, wherein the three-dimensional structure photomask comprises a hollow portion and a body portion, and the hollow portion is matched with a three-dimensional structure model | S101 |
| Performing material conversion on a metal matrix fixed with the three-dimensional structure photomask and obtaining a target metal, wherein the metal matrix is machined first, and a surface of the target metal has a three-dimensional structure matched with the three-dimensional structure model | S102 |

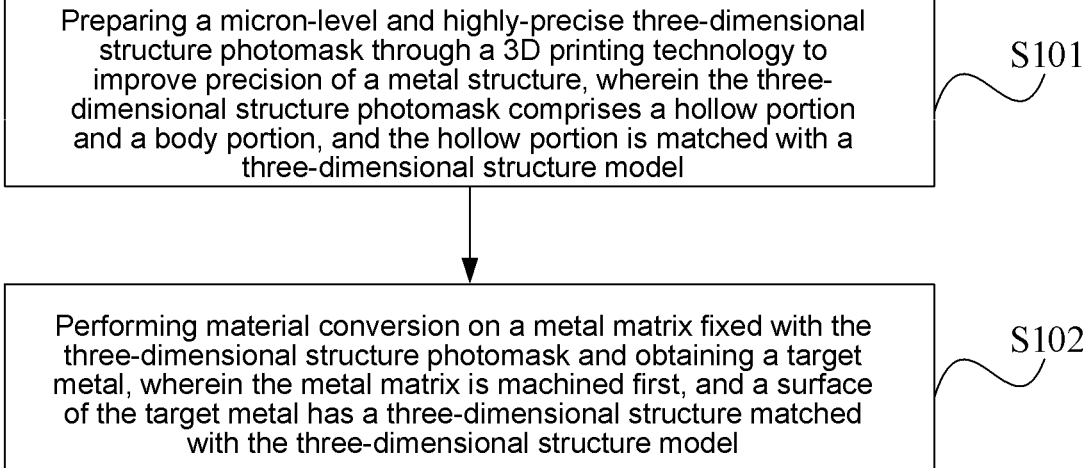

FIG. 1

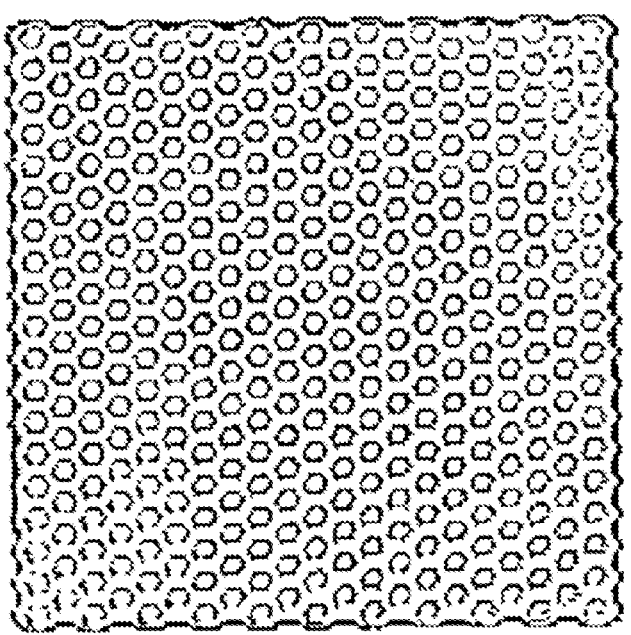

FIG. 2

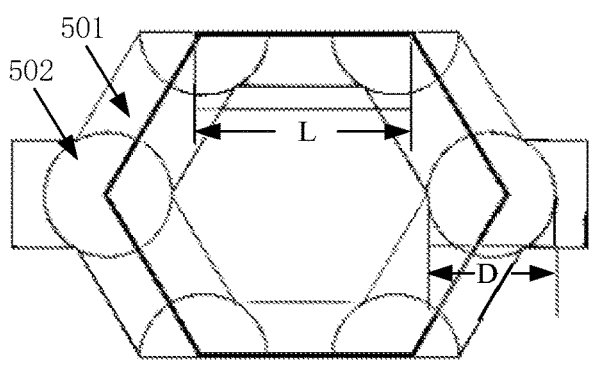
FIG. 3
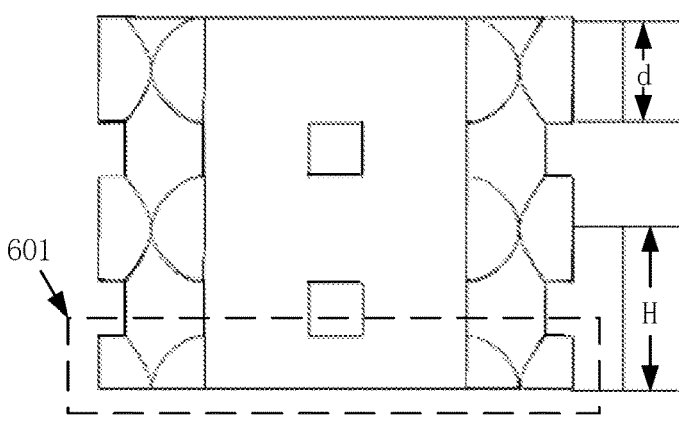
FIG. 4
FIG. 5

3D PRINTING-ASSISTED MULTI-SCALE METAL THREE-DIMENSIONAL SURFACE STRUCTURE PREPARATION METHOD AND PRODUCT

CROSS-REFERENCE TO RELATED APPLICATION

This application is a 371 of international application of PCT application serial no. PCT/CN2023/092861, filed on May 9, 2023, which claims the priority benefit of China application no. 202211328386.X, filed on Oct. 27, 2022. The entirety of each of the above mentioned patent applications is hereby incorporated by reference herein and made a part of this specification.

BACKGROUND

Technical Field

The disclosure relates to the field of micro-nano structure-enhanced heat transfer surfaces, and in particular, relates to a 3D printing-assisted micron-level and millimeter-level multi-scale metal three-dimensional surface structure preparation method and product.

Description of Related Art

With the rapid development of integration and miniaturization of electronic components, many thermal systems with high heat flux densities, such as advanced lasers, light-emitting diodes, radars, microprocessors, motors, etc., need to consume huge amounts of heat. These thermal systems with high heat flux densities also place increasingly stringent requirements on their heat dissipating systems, and the surface of the heat exchange structure is an important factor that determines the performance of each heat dissipating system.

At present, the surface treatment methods performed on the heat exchange structure mainly include changing the surface roughness, adding surface coatings, preparing surface geometric structures, etc. Preparing surface geometric structures has advantages in improving surface heat dissipation efficiency of heat exchange structure compared to changing the surface roughness and adding surface coatings.

However, the conventional geometric structure preparation methods are limited by the precise control of structure scales and shapes, for example, a structure is usually machined and prepared at the millimeter level. Further, multi-scale three-dimensional ordered structures with hollow, porous, and gradient characteristics cannot be prepared. In recent years, although the adopted metal 3D printing technology can complete the three-dimensional structure processing of metal surfaces at the millimeter level scale or sub-millimeter level scale, the micron-level requirements are still not met.

SUMMARY

The embodiments of the disclosure provide a 3D printing-assisted micron-level and millimeter-level multi-scale metal three-dimensional surface structure preparation method and product configured to solve the technical problem of poor processing precision of a three-dimensional metal surface structure and capable of combining a machining method with a 3D printing-assisted multi-scale metal three-dimensional surface structure preparation method to prepare three-dimensional metal surface structures with diverse materials and sizes.

In the first aspect, an embodiment of the disclosure provides a schematic flow chart of a 3D printing-assisted multi-scale metal three-dimensional surface structure preparation method, and the method includes the following steps.

A micron-level and highly-precise three-dimensional structure mask is prepared through a 3D printing technology to improve precision of a metal structure. The three-dimensional structure mask includes a hollow portion and a body portion, and the hollow portion is matched with a three-dimensional structure model.

Material conversion is performed on a metal matrix fixed with the three-dimensional structure mask, and a target metal is obtained. A surface of the target metal has a three-dimensional structure matched with the three-dimensional structure model.

In an embodiment, the 3D printing technology includes a photo-curing 3D printing technology and a laser direct writing 3D printing technology.

A conversion method for the material conversion performed on the metal matrix fixed with the three-dimensional structure mask includes an electroplating method, a chemical plating method, and a chemical vapor deposition method.

Before the material conversion is performed on the metal matrix fixed with the three-dimensional structure mask, the method further includes the following.

The metal matrix is machined.

The performing the material conversion on the metal matrix fixed with the three-dimensional structure mask and obtaining the target metal includes the following.

The three-dimensional structure mask is fixed on a surface of the metal matrix, and a template matrix assembly is formed. Herein, the hollow portion is directly connected to the metal matrix in the three-dimensional structure mask.

Material conversion is performed on the template matrix assembly, and a metal body is obtained.

The three-dimensional structure mask on the metal body is removed, and the target metal is obtained.

A conversion method for the material conversion performed on the metal matrix fixed with the three-dimensional structure mask includes an electroplating method, a chemical plating method, and a chemical vapor deposition method.

The performing the material conversion on the template matrix assembly and obtaining the metal body through the use of the electroplating method includes the following.

The template matrix assembly is immersed in a material conversion solution, and a working electrode is connected.

An auxiliary electrode and the reference electrode are immersed in the material conversion solution.

An electrochemical workstation to be turned on is controlled for a predetermined time period, and the metal body is obtained.

A voltmeter is provided on a measurement loop formed by the working electrode and the reference electrode. An ammeter is provided on a polarization loop formed by the working electrode and the auxiliary electrode.

The removing the three-dimensional structure mask on the metal body and obtaining the target metal includes the following.

The metal body is immersed in a removal resin solution, the three-dimensional structure mask is removed, and the target metal is obtained. The removal resin solution dissolves a photosensitive resin material corresponding to the three-dimensional structure mask and does not react with a metal material corresponding to the target metal.

Before the material conversion is performed on the metal matrix fixed with the three-dimensional structure mask and the target metal is obtained, the method includes the following.

The surface of the metal matrix is polished.

The polished surface of the metal matrix is cleaned through the use of a cleaning reagent.

In the second aspect, an embodiment of the disclosure further provides a component, and the component is a metal component. A three-dimensional structure on a surface of the metal component is obtained by processing through the 3D printing-assisted multi-scale metal three-dimensional surface structure preparation method according to the first aspect.

In an embodiment, the metal component is a heat-dissipating metal component.

A surface structure of the heat-dissipating metal component is a hexagonal mesh porous structure, and the hexagonal mesh porous structure is formed by 3 layers of closely spliced hexagonal mesh structures. A length of a horizontal column of each layer of hexagons ranges from 50 to 500 μm, a diameter of the horizontal column ranges from 30 to 300 μm, and a diameter of a connecting column ranges from 30 to 300 μm. A layer distance between two adjacent layers of the hexagonal mesh structures ranges from 50 to 400 μm.

A surface of the heat-dissipating metal component has a gradient micro-column structure, a diameter of the gradient micro-column structure ranges from 20 to 150 μm, the gradient micro-column structure is centrally symmetrical in a lateral direction, and a spacing gradient of the gradient micro-column structure increases sequentially.

A surface of the heat-dissipating metal component has a trapezoidal dual-flow channel micro-channel structure, and the trapezoidal dual-flow channel micro-channel structure includes a main flow channel and a sub-flow channel. A cross-section of the main flow channel is a trapezoid, a length of an upper base of the trapezoid ranges from 40 to 200 μm, and a length of a lower base of the trapezoid ranges from 60 to 300 μm. The sub-flow channel is a main channel gap structure with an inverse trapezoidal cross section, the sub-flow channel is formed by a side through hole and a top hole, a side length of the top hole ranges from 20 to 100 μm, and a depth of the top hole ranges from 20 to 100 μm.

A surface of the heat-dissipating metal component has a structure combining a straight fin and a straight column hole layer. A fin width of the straight fin ranges from 0.5 to 2 mm, a spacing ranges from 0.5 to 2 mm, and a height ranges from 0.5 to 2 mm. The straight fin is provided with a porous structure, a thickness of the porous structure ranges from 0.1 to 0.5 mm, a pore diameter ranges from 10 to 100 μm, and a pore spacing ranges from 25 to 200 μm.

A surface of the heat-dissipating metal component has a structure combining a ring fin and an S-shaped curved-column circle array. A ring width of the ring fin ranges from 0.1 to 1 mm, a ring spacing ranges from 0.3 to 2 mm, and a height ranges from 0.3 to 2 mm. The S-shaped curved column is formed by a plurality of ¼ rings each with a diameter ranges from 30 to 200 μm, a diameter of the S-shaped curved column ranges from 30 to 100 μm, and a spacing of the S-shaped curved column ranges from 100 to 300 μm.

A surface of the heat-dissipating metal component has structure combining a square trapezoidal terrace and a porous cubic column array. A trapezoidal terrace upper side length of the square trapezoidal terrace ranges from 0.2 to 2 mm, a trapezoidal terrace lower side length ranges from 0.5 to 4 mm, and a height ranges from 0.2 to 1 mm. The porous cubic column array is formed by a plurality of short straight columns each with a diameter ranges from 20-100 μm, and a distance between the straight columns ranges from 50 to 200 μm in a horizontal direction and ranges from 50 to 200 μm in a vertical direction.

In the third aspect, an embodiment of the disclosure further provides a system, and the system is a heat exchange system. The heat exchange system includes the metal component according to the second aspect.

In schematic flow chart of a 3D printing-assisted multi-scale metal three-dimensional surface structure preparation method provided by the embodiments of the disclosure, the micron-level and highly-precise three-dimensional structure mask is prepared through the 3D printing technology to improve precision of the metal structure, and the three-dimensional structure mask includes the hollow portion and the body portion. The hollow portion is matched with the three-dimensional structure model. Material conversion is performed on the metal matrix fixed with the three-dimensional structure mask, and the target metal is obtained. Herein, the metal matrix is machined first, and the surface of the target metal has the three-dimensional structure matched with the three-dimensional structure model.

In the 3D printing-assisted multi-scale metal three-dimensional surface structure preparation method provided by the embodiments of the disclosure, the precision of the metal structure is improved by improving the precision of the template. The multi-scale and multi-material heat exchange structure with micron-level precision and a complex structure is prepared on the metal surface to improve the heat exchange efficiency of metal phase change.

BRIEF DESCRIPTION OF THE DRAWINGS

To make the technical solutions provided in the disclosure or the related art more clearly illustrated, several accompanying drawings required by the embodiments or the related art for description are briefly introduced as follows. Obviously, the drawings in the following description are some embodiments of the disclosure, and for a person having ordinary skill in the art, other drawings can be obtained based on these drawings without any inventive effort.

FIG. 1 is a schematic flow chart of a 3D printing-assisted multi-scale metal three-dimensional surface structure preparation method provided by an embodiment of the disclosure.

FIG. 2 is a top view of a hexagonal mesh porous structure provided by an embodiment of the disclosure.

FIG. 3 is a schematic view of a hexagonal unit structure of the hexagonal mesh porous structure provided by an embodiment of the disclosure.

FIG. 4 is a first side cross-sectional view of the hexagonal mesh porous structure provided by an embodiment of the disclosure.

FIG. 5 is a second side cross-sectional view of the hexagonal mesh porous structure provided by an embodiment of the disclosure.

DESCRIPTION OF THE EMBODIMENTS

Figure 6:
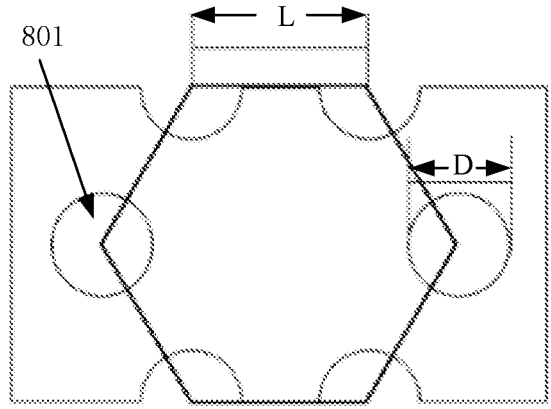
FIG. 6 is a top view of a unit structure of the hexagonal mesh porous structure corresponding to a three-dimensional structure mask provided by an embodiment of the disclosure.

In order to make the objectives, technical solutions, and advantages of the disclosure clearer, description will now be made in detail to clearly and completely present the disclosure, examples of which are illustrated in the accompanying drawings. Nevertheless, the disclosed embodiments are merely part of the embodiments of the disclosure, not all the embodiments. Based on the embodiments of the disclosure, all other embodiments obtained by a person having ordinary skill in the art without making any inventive effort fall within the scope that the disclosure seeks to protect.

FIG. 1 is a schematic flow chart of a 3D printing-assisted multi-scale metal three-dimensional surface structure preparation method provided by an embodiment of the disclosure. With reference to FIG. 1, an embodiment of the disclosure provides a schematic flow chart of a 3D printing-assisted multi-scale metal three-dimensional surface structure preparation method, and the method may include the following steps.

In S101, a micro-scale and highly-precise three-dimensional structure mask is prepared through a 3D printing technology to improve precision of a metal structure. The three-dimensional structure mask includes a hollow portion and a body portion, and the hollow portion is matched with a three-dimensional structure model.

In S102, material conversion is performed on a metal matrix fixed with the three-dimensional structure mask, and a target metal is obtained. Herein, the metal matrix may be machined first, and a surface of the target metal has a three-dimensional structure matched with the three-dimensional structure model.

In step S101, the required three-dimensional structure may be designed through three-dimensional modeling software, and the model corresponding to the designed three-dimensional structure may be imported into the software to analyze and process the three-dimensional structural model. For instance, the 3D drawing software SolidWorks may be used to design and draw a three-layer hexagonal porous structure model, and then the 3D slicing software may be used to analyze and process the drawn three-layer hexagonal porous structure model.

In step S101, the 3D printing technology that may be used includes but not limited to a photo-curing 3D printing technology and a laser direct writing 3D printing technology. The photo-curing 3D printing technology and the laser direct writing 3D printing technology are used as examples for illustration in the embodiments of the disclosure.

Therefore, the specific steps for preparing the micron-level and highly-precise three-dimensional structure mask using the laser direct writing 3D printing technology include the following.

The three-dimensional structural model is analyzed and processed to obtain a laser scanning sequence.

Through the laser direct writing 3D printing technology and according to the laser scanning sequence, a 3D processed three-dimensional structure pattern is exposed on a photoresist of a material to be prepared, and the three-dimensional structure mask is obtained.

To be specific, the three-dimensional structure model is analyzed and processed to obtain the laser scanning sequence. Further, the photoresist is spin-coated on a surface where the material to be prepared is required. Next, the laser direct writing 3D printing technology is used to expose the 3D processed three-dimensional structure pattern on the photoresist of the material to be prepared according to the laser scanning sequence, and the three-dimensional structure mask is obtained.

A highly-precise three-dimensional structure mask is prepared through the laser direct writing 3D printing technology to improve the precision of the metal structure in the embodiments of the disclosure, and a multi-scale and multi-material heat exchange structure with micron-level precision and a complex structure is prepared on a metal surface to improve the heat exchange efficiency of metal phase change.

Further, the specific steps for preparing the micron-level and highly-precise three-dimensional structure mask using the photo-curing 3D printing technology include the following.

The three-dimensional structure model is sliced into layers, and a two-dimensional structure picture collection is obtained. The two-dimensional structure picture collection includes a plurality of two-dimensional structure pictures arranged according to a hierarchical order.

A liquid photosensitive material in a corresponding region is controlled to cure under light induction according to the two-dimensional structure picture collection, and the three-dimensional structure mask is obtained.

The three-dimensional structure mask is formed by stacking multiple cured layers according to a layering sequence. Herein, each cured layer is obtained by controlling the liquid photosensitive material in the corresponding region to cure under light induction according to the corresponding two-dimensional structure picture.

The two-dimensional structure picture collection includes a plurality of two-dimensional structure pictures arranged according to the hierarchical order. After the cured layers are printed based on the two-dimensional structure pictures, the cured layers need to be re-stacked with reference to the three-dimensional structure. Therefore, when the two-dimensional structure pictures are stored, sorting can be achieved by storing the two-dimensional structure pictures in different storage units in sequence according to the hierarchical order, or the two-dimensional structure pictures may be numbered according to the hierarchical order, and the numbers are used as the sorting sequence numbers of the two-dimensional structure pictures. The three-dimensional structure mask is formed by stacking multiple cured layers according to the layering sequence. Herein, each cured layer is obtained by controlling the liquid photosensitive material in the corresponding region to cure under light induction according to the corresponding two-dimensional structure picture.

The three-dimensional structure mask includes the hollow portion and the body portion. Herein, the hollow portion is matched with the three-dimensional structure, so that when the three-dimensional structure mask is fixed on a metal surface, a region where the three-dimensional structure needs to be formed may not be blocked by the body portion of the three-dimensional structure mask. That is, the region where the three-dimensional structure needs to be formed is a non-insulating region, and a chemical reaction can occur during material conversion to form the three-dimensional structure on the metal surface.

The photo-curing 3D printing technology may use a variety of liquid photosensitive materials, for example, photosensitive resin, such as polyurethane acrylate resin, epoxy acrylic resin, polyacrylic resin, and polyether acrylate resin. Since the three-dimensional structure mask in the embodiments of the disclosure is used as a mask in the process of converting metal materials, photosensitive resin with high temperature resistance and/or high hardness may be selected therefrom. The photoresist used in the laser direct writing technology is selected according to actual conditions.

Correspondingly, the abovementioned photosensitive resin and photoresist may be subsequently removed through a chemical solvent, and the used chemical solvent does not react with the metal materials corresponding to the target metal, or through using methods such as high-temperature heating and melting, gas reaction removal, etc.

Further, in step S102, the conversion method for the material conversion performed on the metal matrix fixed with the three-dimensional structure mask may include but not limited to an electroplating method, a chemical plating method, a chemical vapor deposition method, and a chemical reduction method. The obtained target metal has a three-dimensional structure on its surface, where a material of the target metal may be different from that of a matrix material.

Material conversion is performed on the metal matrix (a millimeter-level structure may be prepared by machining first, and its type may be different from that of the target metal) fixed with the three-dimensional structure mask, and the target metal is obtained. The surface of the target metal has micron-level and millimeter-level multi-scale three-dimensional structures.

Further, for the convenience of understanding and description, the electroplating method in the embodiments of the disclosure includes but not limited to a two-electrode electroplating method and a three-electrode electroplating method.

In one embodiment, the process of step S102 is as follows. The two-dimensional structure pictures are sequentially called according to an arrangement order of the plurality of two-dimensional structure pictures, and the three-dimensional structure mask is formed according to the two-dimensional structure picture called each time through a surface projection micro-stereolithography technology.

The surface projection micro-stereolithography technology uses an ultraviolet lithography projection system to project a pattern to be printed onto a liquid surface of liquid photosensitive resin. Since the photosensitive resin undergoes a polymerization reaction under ultraviolet light irradiation to complete the solid state conversion, the part of the liquid photosensitive resin projected by the ultraviolet light on the liquid surface is cured and is quickly micro-three-dimensionally formed. The complex three-dimensional model is then directly processed from the digital model, and the production of the target three-dimensional structure is completed.

In the above process, each time a two-dimensional structure picture is called, the above-mentioned ultraviolet lithography projection system is used to project the corresponding pattern of the called two-dimensional structure picture onto the liquid surface of the liquid photosensitive resin. Not until a layer of cured layer is obtained will the next two-dimensional structure picture be called. Further, the corresponding pattern of the currently called two-dimensional structure picture is re-projected on the basis of the originally-obtained cured layer to obtain another layer of cured layer. By analogy, each cured layer being printed is printed based on the cured layer obtained last time.

In the embodiments of the disclosure, the working parameters of the 3D printing system corresponding to the surface projection micro-stereolithography technology may be set as follows. A minimum line width of the plane is set to 2 $\mu$m, a minimum line width of the three-dimensional structure is set to 10 $\mu$m, a printing layer thickness is set, that is, the layer thickness is 5 $\mu$m to 20 $\mu$m, a maximum printing height is set to 10 mm, a single-format size in a printing format is set to 3.84 mm×2.16 mm, and a splicing format size is 38.4 mm×21.6 mm. Herein, when the size of the cured layer to be produced is greater than the single-format size, the 3D printing system may divide it into regions, and the ultraviolet light scans and projects one region at a time. When all regions are scanned, a cured layer is printed, and the splicing error in this process is less than 10 $\mu$m.

In an embodiment, the two-dimensional structure pictures being sequentially called according to the arrangement order of the plurality of two-dimensional structure pictures and the three-dimensional structure mask being formed according to the two-dimensional structure picture called each time through the surface projection micro-stereolithography technology specifically includes the following process.

In S1, the two-dimensional structure picture ranked first in the two-dimensional structure picture collection is called as a current two-dimensional structure picture, the pattern corresponding to the current two-dimensional structure picture is projected onto the surface of the liquid photosensitive material through ultraviolet light and is cured, and an initial mask is obtained.

In S2, the initial mask is moved downward, so that there is a liquid photosensitive material with a predetermined layer thickness above the initial mask In S3, the next two-dimensional structure picture of the current two-dimensional structure picture in the two-dimensional structure picture collection is called to replace the current two-dimensional structure picture.

In S4, the pattern corresponding to the current two-dimensional structure picture is projected onto the surface of the liquid photosensitive material above the initial mask through ultraviolet light to update the initial mask. Next, step S2 is repeatedly performed until the current two-dimensional structure picture is the last-ordered two-dimensional structure picture in the two-dimensional structure picture collection, and step S5 is then performed.

In S5, the current initial mask is used as the three-dimensional structure mask.

In step S1, if the two-dimensional structure pictures are stored in different units of a same storage block in sequence, the two-dimensional structure pictures are accessed and called starting from a first unit in the storage block. If the two-dimensional structure pictures are associated with numbers set according to the hierarchical order, the two-dimensional structure pictures are called from the smallest number to the largest number.

In step S1, the pattern corresponding to the current two-dimensional structure picture is projected onto the surface of the liquid photosensitive material through ultraviolet light, and the initial mask obtained by curing is a layer of the body portion of the three-dimensional structure mask. In terms of shape, the pattern corresponding to the current two-dimensional structure picture is essentially in a mutually fitting relationship with the current two-dimensional structure.

In step S2, the predetermined layer thickness is the layer thickness of the three-dimensional structural model. In this step, the initial mask is moved downward so that uncured liquid photosensitive material is laid on top of the cured initial mask for preparation of another cured layer.

In step S3, the two-dimensional structure picture in the next unit or the two-dimensional structure picture of the next number may be called to prepare the next cured layer.

In step S4, the pattern corresponding to the current two-dimensional structure image needs to be projected onto the surface of the liquid photosensitive material above the initial mask through ultraviolet light, so that the cured layer formed in step S4 is stacked on the original initial mask. The initial mask with a layer of cured layer re-stacked at this time is used as the updated initial mask, and the action of moving the initial mask downward to the predetermined layer thickness in step S2 is performed.

In step S5, when the current two-dimensional structure picture is the last two-dimensional structure picture in the two-dimensional structure picture collection, it means that what is currently being prepared is the last layer in the three-dimensional structure mask. After the last layer of curing is completed, the three-dimensional structure mask may be obtained, and there is no need to move the three-dimensional structure mask downward.

In an embodiment, the initial mask may be directly moved downward by a distance of the predetermined layer thickness in a container containing the liquid photosensitive material in the above step S2.

Alternatively, the initial mask is moved downward by a first predetermined distance and then moved upward by a second predetermined distance. Herein, the difference obtained by subtracting the second determined distance from the first determined distance is the predetermined layer thickness. The predetermined layer thickness is greater than zero.

Compared to directly moving the initial mask downward by the predetermined layer thickness distance in the container containing the liquid photosensitive material, the method of moving the initial mask downward by the first predetermined distance and then upward by the second predetermined distance allows the initial mask to be lowered by a larger distance first. In this way, it is ensured that the initial mask may be completely immersed in the liquid photosensitive material, and that the liquid photosensitive material is covered above the initial mask. The initial mask is then raised a smaller distance, and the distance between the initial mask and the liquid surface of the liquid photosensitive material is adjusted, so that the next cured layer can be cured based on the initial mask. In this way, the integrity of each cured layer and the tightness of the fit between the cured layers are ensured.

The photo-curing 3D printing technology is adopted in the embodiments of the disclosure to prepare a highly-precise three-dimensional structure mask. By slicing the three-dimensional structure model in layers, the three-dimensional structure is split into two-dimensional structures for processing. By improving the processing precision of each layer of the two-dimensional structure, the precision of the three-dimensional structure is improved. By using the characteristics of the liquid photosensitive material that can be cured under light induction, the cured layer corresponding to each two-dimensional structure is prepared in the embodiments of the disclosure. That is, by controlling the modulated light to illuminate the surface of the liquid photosensitive material, specific regions are selectively exposed to generate specific structures, so that the three-dimensional structural mask with micron-level precision may be formed using an optical system with a maximum optical resolution of 2 μm. The three-dimensional structure mask is fixed on the surface of the metal matrix for material conversion. The surface of the metal matrix portion is insulated by the body portion of the three-dimensional structure mask, and the required three-dimensional structure is formed by material conversion through the hollow portion of the three-dimensional structure mask. Through the above 3D printing-assisted multi-scale metal three-dimensional surface structure preparation method, a heat exchange structure with micron-level precision and a complex structure may be prepared on the metal surface, so that the heat exchange efficiency of metal phase change is improved.

The material conversion process in the 3D printing-assisted multi-scale metal three-dimensional surface structure preparation method is explained as follows. In one embodiment, step S102 includes the following.

The three-dimensional structure mask is fixed on the surface of the metal matrix, and a template matrix assembly is formed. The hollow portion is directly connected to the metal matrix in the three-dimensional structure mask.

Material conversion is performed on the template matrix assembly, and a metal body is obtained.

The three-dimensional structure mask on the metal body is removed, and the target metal is obtained.

It should be noted that before material conversion is performed on the metal matrix fixed with the three-dimensional structure mask, the metal matrix first needs to be machined first.

Further, the three-dimensional structure mask and the metal matrix are clamped and fixed by a clamp, or the three-dimensional structure mask and the metal matrix are bonded through a liquid photosensitive material. In this process, the hollow portion needs to be directly connected to the metal matrix in the three-dimensional structure mask.

In an embodiment, the material conversion method or other methods are performed on the metal matrix fixed with the three-dimensional structure mask to obtain the target metal (e.g., copper, nickel, chromium, gold, zinc, silver and other metal and their alloys). Herein, the conversion method includes but not limited to the electroplating method, the chemical plating method, the chemical vapor deposition method, and the chemical reduction method, and the conversion method includes the following. The metal matrix that needs to be prepared for a metal-based multi-scale three-dimensional structure (which may be different from the target metal to meet the diversity of materials) is first machined according to needs to complete the preparation of a millimeter-level structure. The three-dimensional structure mask is then fixed on the surface of the metal matrix to form a template matrix assembly to achieve size diversity. Herein, the hollow portion is directly connected to the metal matrix in the three-dimensional structure mask. The pores that are expected to be retained during machining are first filled and cured with liquid organic matter to complete and then remove it after the metal-based multi-scale three-dimensional structure is formed.

Further, the metal body is immersed in the removal resin solution, the removal resin solution may also be heated to remove the three-dimensional structure mask, and the target metal is obtained.

In an embodiment, the resin removal solution may be an alkaline solution, for example, a sodium hydroxide solution may be used. Herein, the removal resin solution dissolves the photosensitive resin material corresponding to the three-dimensional structure mask and does not react with the metal material corresponding to the target metal.

Further, the two-electrode plating method or the three-electrode plating method is used for material conversion. It should be further noted that electroplating is only one method in the embodiments of the disclosure, and an electroless plating method and a chemical reduction method may also be used to replace the electroplating method.

Herein, the material conversion process using the two-electrode plating method is provided as follows. The template matrix assembly is immersed in the electroplating solution and connected to the working electrode, and the auxiliary electrode is immersed in the material conversion solution. The working electrode is connected to the negative electrode of the power supply, the auxiliary electrode is connected to the positive electrode of the power supply, and the power supply is turned on so that a reduction reaction occurs near the working electrode to complete the electroplating of the template matrix assembly.

Herein, the material conversion process using the electroless plating method is provided as follows. The template matrix assembly is immersed in an electroless plating pretreatment solution in sequence. The electroless plating pretreatment solution may include one or more of the following: a chemical degreasing solution, a chemical roughening solution, a chemical sensitization solution, a chemical activation solution, and a chemical degumming solution. Before being immersed in the electroless plating pretreatment solution of the next step, the template matrix assembly needs to be washed with water to clean the remaining electroless plating pretreatment solution of the previous step. Next, the template matrix assembly is immersed in the electroless plating solution, and is appropriately heated or stirred to complete the electroless plating of the template matrix assembly.

Herein, the material conversion process using the chemical reduction method is provided as follows. A polymer containing polar groups and the target metal salt capable of forming a complex with the polymer are dissolved in a solvent to prepare a uniform pretreatment solution. The template matrix assembly is immersed in the pretreatment solution, the pretreatment solution is evaporated to dryness and then placed in the reduction solution, and the material conversion using the chemical reduction method is completed.

In an embodiment, the material conversion process using the three-electrode plating method is provided as follows. The template matrix assembly is immersed in the material conversion solution and connected to the working electrode. The auxiliary electrode and the reference electrode are immersed in the material conversion solution. An electrochemical workstation is controlled to be turned on for a predetermined time period, and the metal body is obtained.

Herein, a voltmeter is provided on a measurement loop formed by the working electrode and the reference electrode. The voltmeter measures the reference electrode in the loop or the reference of the applied working electrode potential in the loop to test the electrochemical reaction process of the electrode and then controls the electrochemical reaction process. An ammeter is provided on a polarization loop formed by the working electrode and the auxiliary electrode, and the polarization loop functions to conduct current.

In the embodiments of the disclosure, the material conversion solution may be a copper pyrophosphate solution, which is obtained by mixing and then uniformly stirring copper pyrophosphate, potassium pyrophosphate, ammonium citrate, and deionized water mechanically.

In the actual material conversion process, if the three-dimensional structure mask and the metal matrix are clamped and fixed by a clamp, after a certain time period of material conversion, some of the hollows in the three-dimensional structure mask are filled with metal. At this time, the three-dimensional structure mask and the surface of the metal matrix may maintain a tight fit without the need for a clamp, so that the clamp may be removed and the remaining part of the material conversion may be completed to lower the impact of the clamp on the material conversion.

Taking the three-electrode plating method as an example, the electrochemical workstation is used to set reasonable electrochemical parameters for material conversion in the embodiments of the disclosure. The electrochemical workstation parameters may be set as follows.

The potential range is ±10V, the current range is ±250 mA, and the lower limit of current measurement is 10 pA. The electrochemical testing technologies supported by the electrochemical workstation include but not limited to: a multi-current step (ISTEP) method and a bulk electrolysis with Coulometry (BE) method.

Compared to the two-electrode plating method, the three-electrode plating method adopted in the embodiments of the disclosure may prevent the following problems caused by the two-electrode system from occurring. Once a current flows through the two-electrode system, the auxiliary electrode may be polarized, resulting in a change in potential and inaccurate potential measured by the working electrode. Further, there may also be the problem of voltage drop in the solution when the current flows through, which may lead to unstable electrochemical reaction and affect the electroplating effect. The three-electrode plating method introduces a reference electrode and forms a measurement loop with the working electrode, so that the potential of the working electrode may be measured and controlled. Since there is no polarization current flowing in the measurement loop and only a very small measurement current is present, it may not interfere with the polarization state of the working electrode as well as the stability of the reference electrode. In turn, the potential and current control during the electrochemical reaction process may be achieved at the same time, so that the stability of the electrochemical reaction process is ensured, and a favorable electroplating effect is achieved.

In an embodiment, before the three-dimensional structure mask is fixed on the surface of the metal matrix and the template matrix assembly is formed, the metal matrix also needs to be pre-treated to remove burrs, oil stains, and oxides on its surface. The specific steps include the following.

The surface of the metal matrix is polished.

The polished surface of the metal matrix is cleaned through the use of a cleaning reagent.

Herein, the surface of the polished metal matrix may be cleaned sequentially with the following reagents: acetone, absolute ethanol, dilute sulfuric acid, and deionized water.

Herein, acetone is used to clean the oil stains on the surface of the metal matrix, absolute ethanol is used to clean the acetone remaining on the surface of the metal matrix, dilute sulfuric acid is used to remove oxides, such as copper oxides, on the surface of metal matrix, and deionized water is used to clean the remaining dilute sulfuric acid. During the above cleaning process, the polished metal matrix may be soaked in the cleaning reagent for 3 minutes to 10 minutes.

It should be noted that the above description of the mass percentage of dilute sulfuric acid and the description of the soaking time during the cleaning process are only examples of the embodiments of the disclosure and are not the sole limitation of the embodiments of the disclosure.

By polishing and cleaning the surface of the metal matrix in advance to remove burrs, oil, and oxides on the surface, the three-dimensional structure formed by material conversion may adhere more closely to the surface of the metal matrix in the embodiments of the disclosure.

In an embodiment, before the three-dimensional structure mask on the metal body is removed, an excessive material conversion portion may also be smoothed and polished. After that, the target metal is obtained by removing the three-dimensional structure mask on the metal body, and steps of removing three-dimensional structure mask are performed to obtain the target metal.

On the other hand, the disclosure further provides a component, and the component is a metal component. A surface of the metal component has a three-dimensional structure, and the three-dimensional structure on the surface of the metal component is obtained by processing through the 3D printing-assisted multi-scale metal three-dimensional surface structure preparation method according to any embodiments of the above. For instance, a metal component having a hexagonal mesh porous structure on the surface is included.

The hexagonal mesh porous structure shown in FIG. 2 may be prepared through the 3D printing-assisted multi-scale metal three-dimensional surface structure preparation method according to any embodiments of the above. FIG. 2 is a top view of a hexagonal mesh porous structure provided by an embodiment of the disclosure. As shown in FIG. 3 to FIG. 5, FIG. 3 is a schematic view of a hexagonal unit structure of the hexagonal mesh porous structure provided by an embodiment of the disclosure, FIG. 4 is a first side cross-sectional view of the hexagonal mesh porous structure provided by an embodiment of the disclosure, and FIG. 5 is a second side cross-sectional view of the hexagonal mesh porous structure provided by an embodiment of the disclosure. The hexagonal mesh porous structure is formed by 3 layers of closely spliced hexagonal mesh structures. A hexagon 501 is formed by connecting six equal-length horizontal columns, and two adjacent layers of mesh structures are connected by connecting columns 502 at hexagon endpoints of the upper and lower layers. Herein, in order to ensure the tightness of the connection between the hexagonal mesh porous structure and the surface of the metal matrix, as shown in FIG. 4, only ½ of the third layer of a mesh porous structure 601 connected to the surface of the metal matrix remains.

Figure 7:
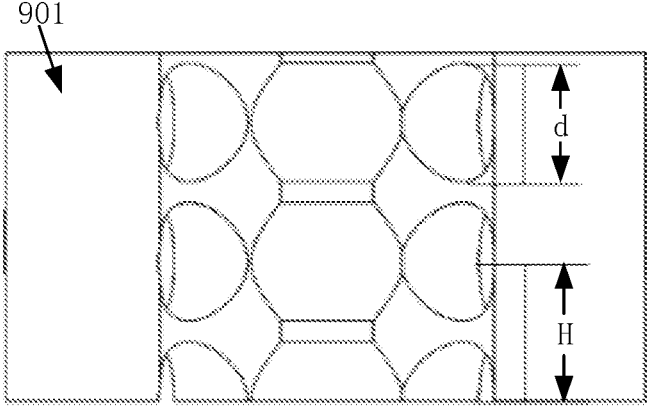
FIG. 7 is a first side cross-sectional view of the hexagonal mesh porous structure corresponding to the three-dimensional structure mask provided by an embodiment of the disclosure.
Figure 8:
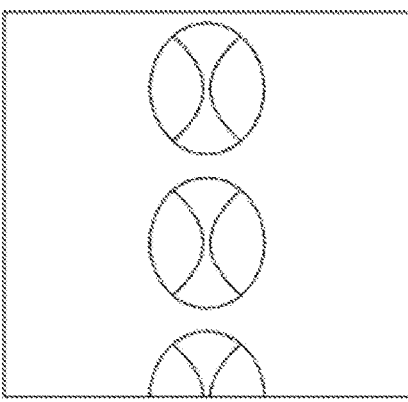
FIG. 8 is a second side cross-sectional view of the hexagonal mesh porous structure corresponding to the three-dimensional structure mask provided by an embodiment of the disclosure.

Corresponding to the above-mentioned hexagonal mesh porous structure, its three-dimensional structure mask forms an inverse structure of the abovementioned hexagonal mesh porous structure, as shown in FIG. 6 to FIG. 8. FIG. 6 is a top view of a unit structure of the hexagonal mesh porous structure corresponding to a three-dimensional structure mask provided by an embodiment of the disclosure, FIG. 7 is a first side cross-sectional view of the hexagonal mesh porous structure corresponding to the three-dimensional structure mask provided by an embodiment of the disclosure, and FIG. 8 is a second side cross-sectional view of the hexagonal mesh porous structure corresponding to the three-dimensional structure mask provided by an embodiment of the disclosure. That is, the hollow portion of the three-dimensional structure mask is matched with the hexagonal mesh porous structure. As shown in FIG. 6, in order to facilitate the observation of the completion of material conversion and prevent excessive material conversion from depositing too much copper metal, only a through hole 801 with a same diameter as a connecting column 601 is left on the two-dimensional structure corresponding to the first layer of mesh porous structure. As shown in FIG. 7, in order to prevent excessive deposition of metal around the required hexagonal mesh porous structure during the material conversion process, a thin layer 901 is designed around its inverse structure to limit the range of metal deposition.

In this embodiment, a hexagonal mesh porous structure with the following structural parameters is prepared during the experimental stage for use in heat transfer application scenarios such as spray cooling and pool boiling. In the following, spray cooling is taken as an example, and the hexagonal mesh porous structure is used as an experimental object to test its heat transfer performance.

A length of a horizontal column of each layer of hexagons ranges from 50 to 500 micrometres (μm), a diameter of the horizontal column ranges from 30 to 300 μm, and a diameter of a connecting column ranges from 30 to 300 μm. A layer distance between two adjacent layers of the hexagonal mesh structures ranges from 50 to 400 μm. In an embodiment, a length L of the horizontal column=300 μm, a diameter d of the horizontal column=170 μm, and a diameter D of the connecting column=170 μm. Between two adjacent layers of the hexagonal mesh structures, a layer distance H=200 μm.

Figure 9:
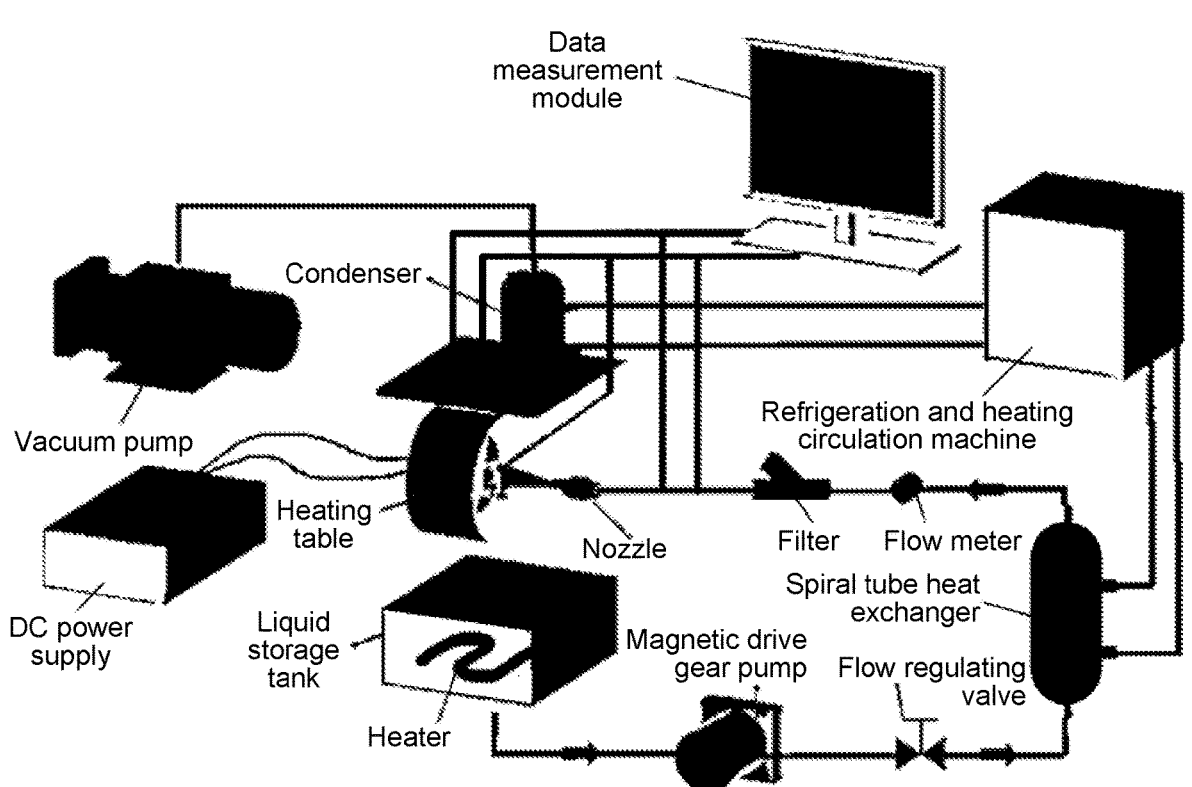
FIG. 9 is a schematic structural view of a spray cooling device provided an embodiment of the disclosure.

As shown in FIG. 9, FIG. 9 is a schematic structural view of a spray cooling device provided an embodiment of the disclosure. The spray cooling device used in this experimental stage is as follows and includes the following.

A working fluid circulation loop, a cooling oil circulation loop, a heating table, a heating module, and a data measurement module are included. Herein the working fluid circulation loop is provided with a heater, a liquid storage tank, a magnetic drive gear pump, a flow regulating valve, a spiral tube heat exchanger, a flow meter, a filter, and a nozzle, and is used to ensure that the working fluid is transported to the nozzle at the set temperature, pressure, and flow rate and sprayed onto the metal surface on the heating table. The working fluid in the cooling circulation is refrigerant heat transfer oil. The cooling circulation loop is provided with a vacuum pump, a condenser, a refrigeration and heating cycle machine, and a spiral tube heat exchanger, and is used to provide a cold source for the spray cooling device and adjust the temperature of the working fluid. The data measurement module includes a thermocouple, a gear flow meter, a pressure transmitter, and a data collector, and is used to complete the recording of experimental data. The heating module includes a DC power supply, a cylinder heater, and an insulation material, supplies power to the cylindrical heater on the heating table through the DC power supply, and uses the insulating material to assist in heat preservation to ensure that the metal surface in the experiment can obtain sufficient heat.

Figure 10:
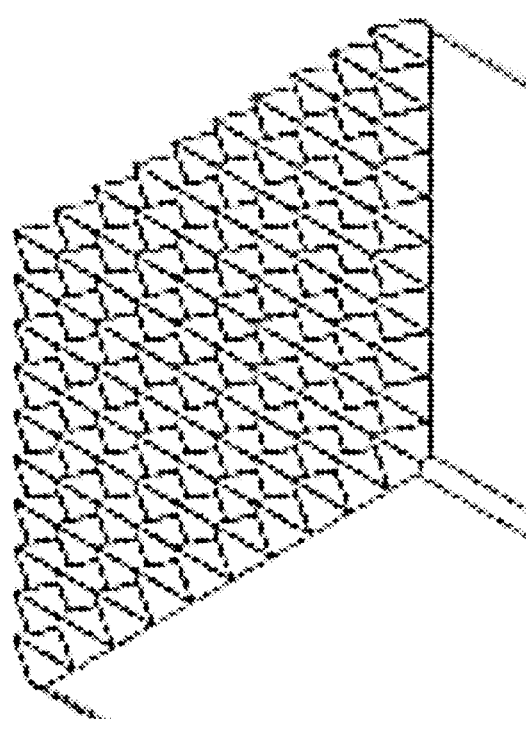
FIG. 10 is a schematic view of a pyramid fin structure provided by an embodiment of the disclosure.
Figure 11:
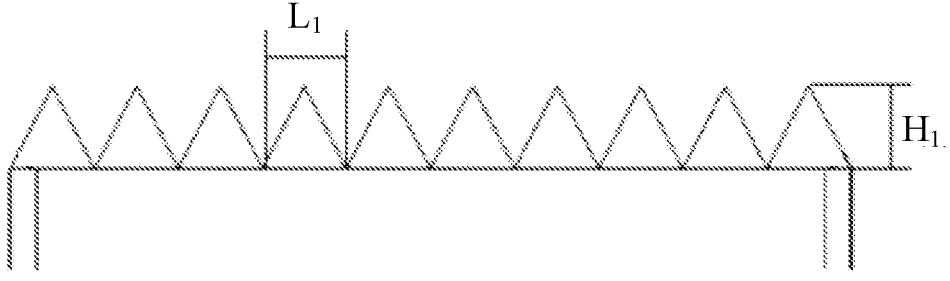
FIG. 11 is a side view of the pyramid fin structure provided by an embodiment of the disclosure.

A pyramid fin structure is used as the first reference object, and a polished planar structure is used as the second reference object. Herein, the pyramid fin structure is shown in FIG. 10 and FIG. 11. FIG. 10 is a schematic view of a pyramid fin structure provided by an embodiment of the disclosure, and FIG. 11 is a side view of the pyramid fin structure provided by an embodiment of the disclosure. A length of a bottom side of the pyramid structure is L1=1 mm, and a height of the pyramid is H1=1 mm. The pyramid fin structure is prepared by machining.

The surface sizes of both the experimental object and the reference object were taken to be 1×1 cm$^2$. The experiment was carried out under atmospheric pressure. The experimental working fluid was both deionized water, the spray flow rates were both 2.3 cm$^3$/s, and the distances between the nozzles and the metal surfaces were both 2.1 cm. The experimental object and reference object were sequentially cleaned in an ultrasonic water bath soaked in acetone, absolute ethanol, dilute sulfuric acid, and deionized water to remove surface organic matters, and then spray cooling experiments were performed separately to obtain the experimental results shown in FIG. 12 to FIG. 13.

Figure 12:
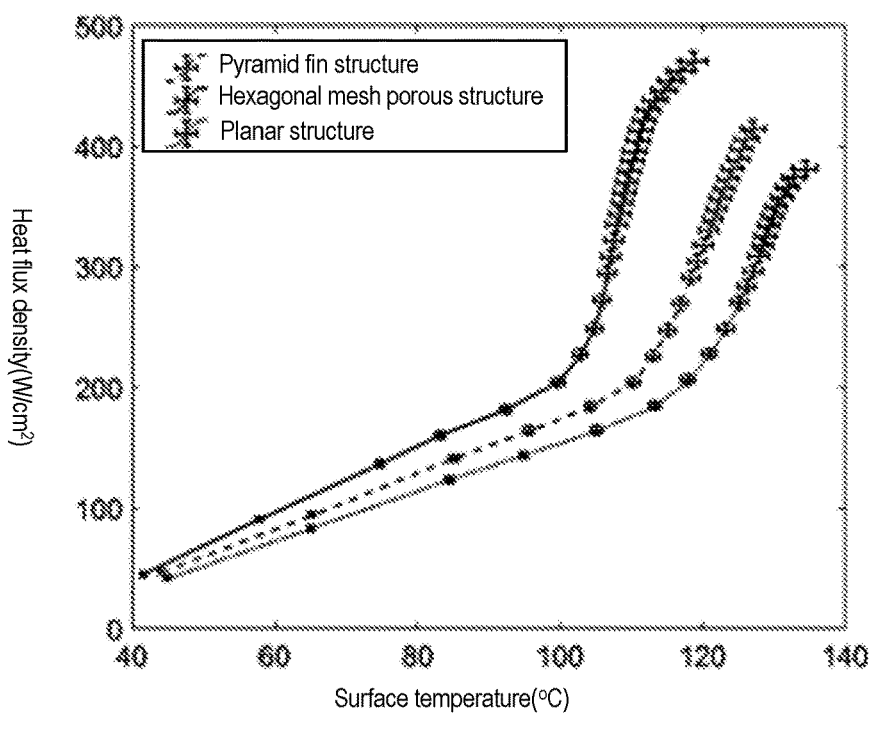
FIG. 12 is a line graph of the heat flux density of spray cooling provided by an embodiment of the disclosure.
Figure 13:
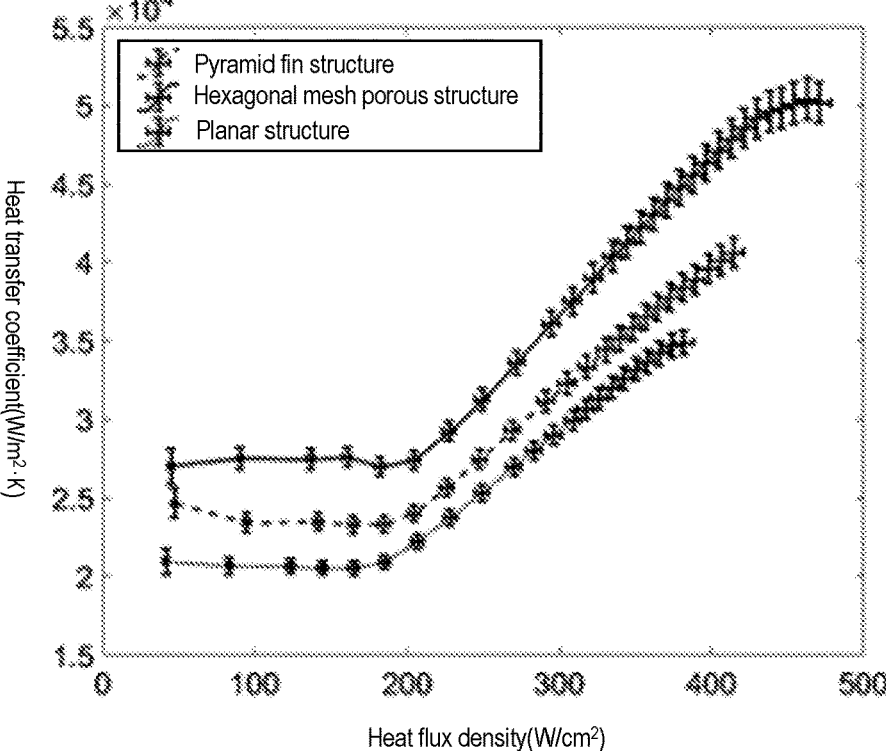
FIG. 13 is a line graph of the heat transfer coefficient of spray cooling provided by an embodiment of the disclosure.

According to FIG. 12 and FIG. 13, it can be seen that FIG. 12 is a line graph of the heat flux density of spray cooling provided by an embodiment of the disclosure, and FIG. 13 is a line graph of the heat transfer coefficient of spray cooling provided by an embodiment of the disclosure. The heat flux density of the hexagonal mesh porous structure can reach 470.3 W/cm$^2$, and the heat transfer coefficient can reach 5.041×10$^4$ W/m$^2$·K. Compared to the pyramid fin structure and the planar structure, the heat flux density increases by 13.4% and 23.2% respectively, and the heat transfer coefficient increases by 24.2% and 44.6% compared with the pyramid fin structure and the planar structure respectively.

Compared to the pyramid fin structure and the planar structure with millimeter precision, the heat flux density and the heat transfer coefficient in the heat transfer performance are improved. The hexagonal mesh porous structure prepared by the 3D printing-assisted multi-level metal three-dimensional surface structure preparation method provided in the above embodiments has a structural precision of micron scale. Further, the complex and fine porous structure is conducive to improving the efficiency of metal phase change and heat transfer.

In addition to the hexagonal mesh porous structure described above, through the 3D printing-assisted multi-scale metal three-dimensional surface structure preparation method described in any of the above embodiments, the following three-dimensional structures may also be prepared, including but not limited to: a gradient micro-column structure and a trapezoidal dual-flow channel micro-channel structure.

Figure 14:
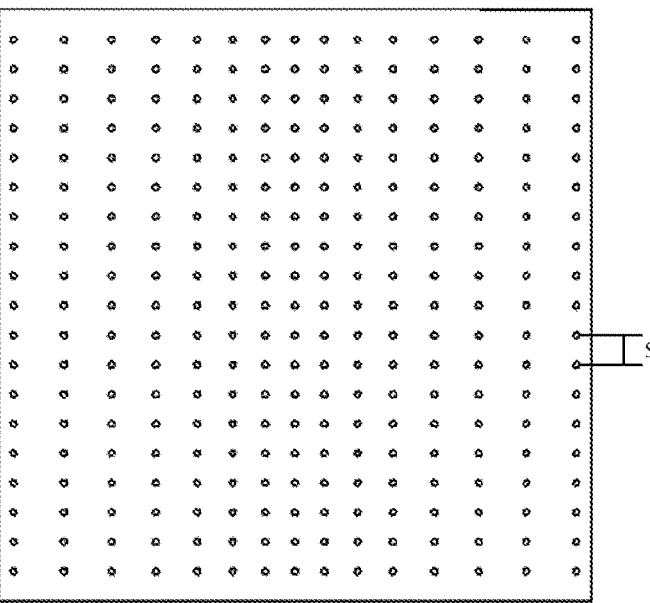
FIG. 14 is a side view of a gradient micro-column structure provided by an embodiment of the disclosure.
Figure 15:
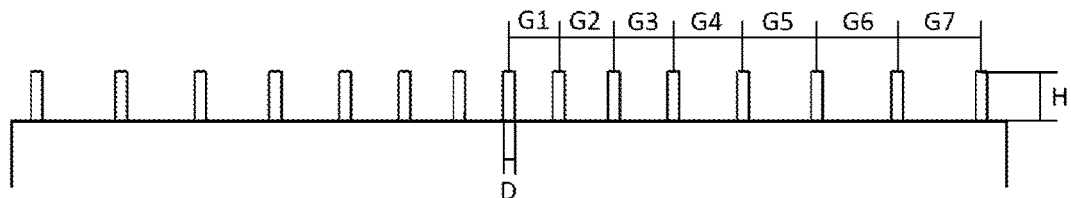
FIG. 15 is a top view of the gradient micro-column structure provided by an embodiment of the disclosure.

As shown in FIG. 14, FIG. 14 is a side view of a gradient micro-column structure provided by an embodiment of the disclosure, and FIG. 15 is a top view of the gradient micro-column structure provided by an embodiment of the disclosure. A diameter of the gradient micro-column structure ranges from 20 to 150 μm, the gradient micro-column structure is centrally symmetrical in a lateral direction, and a spacing gradient of the gradient micro-column structure increases sequentially. In an embodiment, a diameter D of the gradient micro-column structure=20 μm, the gradient micro-column structure is centrally symmetrical in the lateral direction, the spacing gradient of the gradient micro-column structure increases, and the spacing increases by 0.01 mm in sequence. G1=0.1 mm, G2=0.11 mm, G3=0.12 mm, G4=0.13 mm, G5=0.14 mm, G6=0.15 mm, G7=0.16 mm, the spacing in a longitudinal direction remains consistent, and S=0.1 mm. The above gradient micro-column structure may be used for boiling experimental research.

Figure 16:
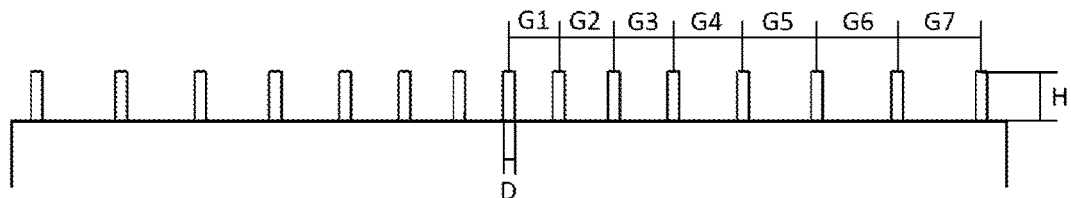
FIG. 16 is a top view of a trapezoidal dual-flow channel micro-channel structure provided by an embodiment of the disclosure.
Figures 17, 18:
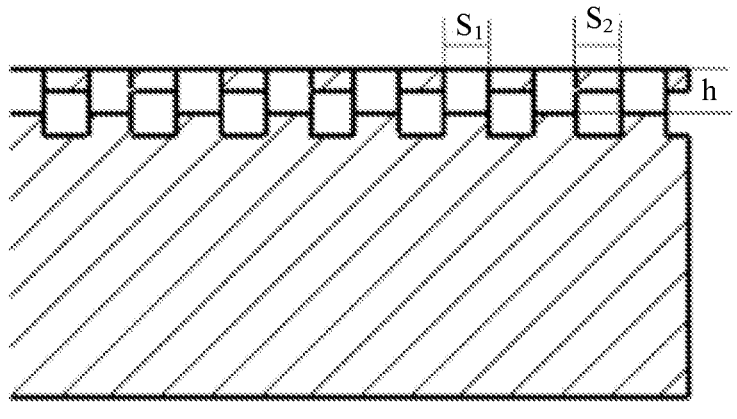
FIG. 17 is a side cross-sectional view of the trapezoidal dual-flow channel micro-channel structure provided by an embodiment of the disclosure.
FIG. 18 is a side view of the trapezoidal dual-flow channel micro-channel structure provided by an embodiment of the disclosure.

As shown in FIG. 16 to FIG. 18, FIG. 16 is atop view of a trapezoidal dual-flow channel micro-channel structure provided by an embodiment of the disclosure, FIG. 17 is a side cross-sectional view of the trapezoidal dual-flow channel micro-channel structure provided by an embodiment of the disclosure, and FIG. 18 is a side view of the trapezoidal dual-flow channel micro-channel structure provided by an embodiment of the disclosure. The trapezoidal dual-flow channel micro-channel structure includes a main flow channel and a sub-flow channel. A cross-section of the main flow channel is a trapezoid, a length of an upper base of the trapezoid ranges from 40 to 200 μm, and a length of a lower base of the trapezoid ranges from 60 to 300 μm. In an embodiment, a length L41 of the upper base of the trapezoid=40 μm, a length L42 of the lower base of the trapezoid=60 μm, a height H4 of the trapezoid=50 μm, a total length of the main channel is 2 mm, and a main channel spacing G4=0.1 mm. The sub-flow channel is a main channel gap structure with an inverse trapezoidal cross section, as shown in FIG. 17. The sub-flow channel is formed by a side through hole and a top hole. A side length of the top hole ranges from 20 to 100 μm, and a depth of the top hole ranges from 20 to 100 μm. In an embodiment, a side length S$_1$ of the top hole=20 μm, the depth of the top hole is 20 μm, a side length S$_2$ of the side through hole=20 μm, and a distance h between an axis of the side through hole and an upper surface=10 μm. The abovementioned trapezoidal dual-flow channel micro-channel structure may be suitable for micro-channel flowing and heat dissipating.

Through the 3D printing-assisted multi-scale metal three-dimensional surface structure preparation method described in any of the above embodiments, combined with ordinary machining, the following three-dimensional structures may also be prepared, including but not limited to: a structure combining a straight fin and a straight column hole layer, a structure combining a ring fin layer and an S-shaped curved column array, and a structure combining a square trapezoidal terrace and a porous cubic column array.

Figure 19:
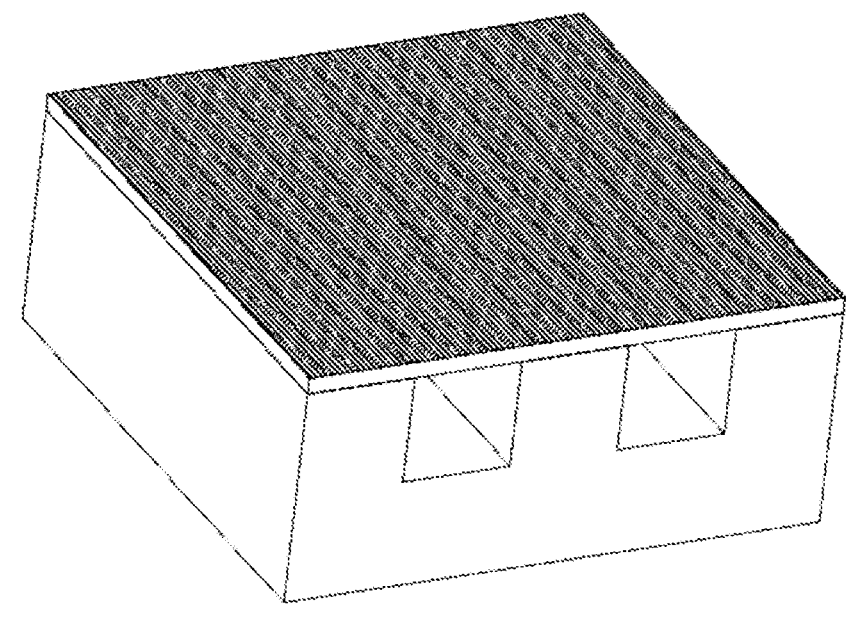
FIG. 19 is a schematic view of a structure combining a straight fin and a straight column hole layer provided by an embodiment of the disclosure.
Figure 20:
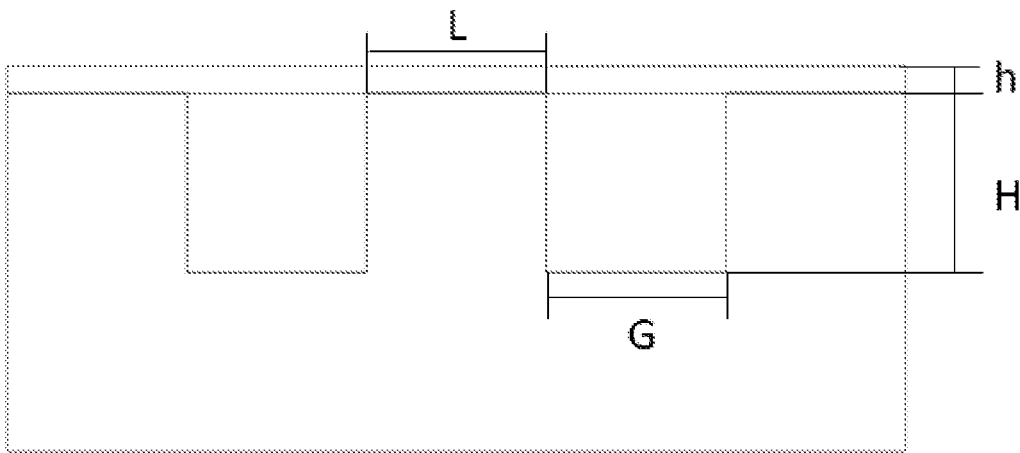
FIG. 20 is a schematic side view of the structure combining the straight fin and the straight column hole layer provided by an embodiment of the disclosure.
Figure 21:
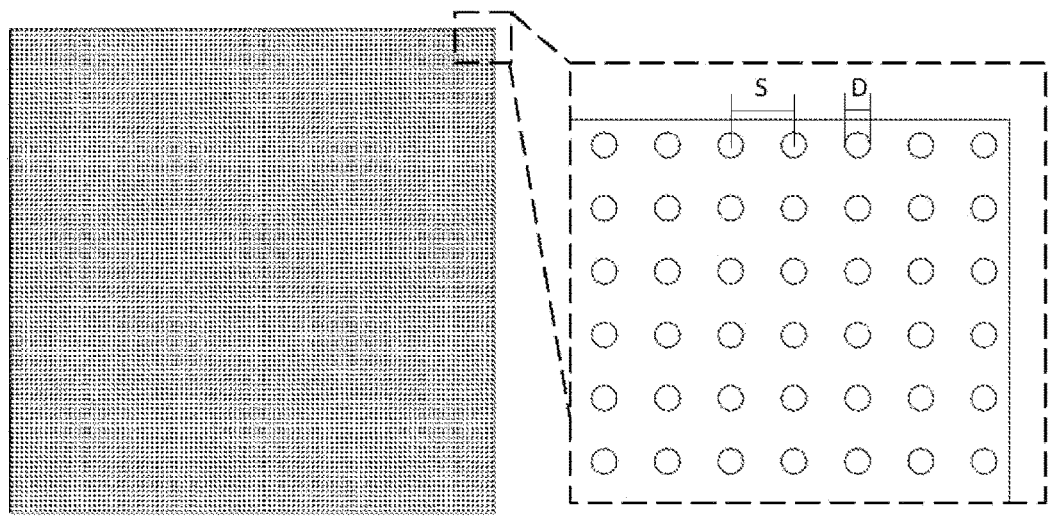
FIG. 21 is a schematic top view of the structure combining the straight fin and the straight column hole layer provided by an embodiment of the disclosure.

As shown in FIG. 19 to FIG. 20, FIG. 19 is a schematic view of a structure combining a straight fin and a straight column hole layer provided by an embodiment of the disclosure, FIG. 20 is a schematic side view of the structure combining the straight fin and the straight column hole layer provided by an embodiment of the disclosure, and FIG. 21 is a schematic top view of the structure combining the straight fin and the straight column hole layer provided by an embodiment of the disclosure. In the structure combining the straight fin and the straight column hole layer, the straight fin is prepared through machining. A fin width of the straight fin ranges from 0.5 to 2 mm, a spacing ranges from 0.5 to 2 mm, and a height ranges from 0.5 to 2 mm. In an embodiment, a fin width L=1 mm, a gap G=1 mm, and a height H=1 mm. A porous structure on a top portion of the fin is prepared by the 3D printing-assisted multi-scale metal three-dimensional surface structure preparation method provided by the disclosure. A thickness of the porous structure ranges from 0.1 to 0.5 mm, a pore diameter ranges from 10 to 100 μm, and a pore spacing ranges from 25 to 200 μm. In an embodiment, a thickness h=0.2 mm, a pore diameter D=10 μm, and a pore spacing S=25 μm in the porous structure. The structure combining the straight fin and straight column hole layer may be suitable for condensation heat transfer.

Figure 22:
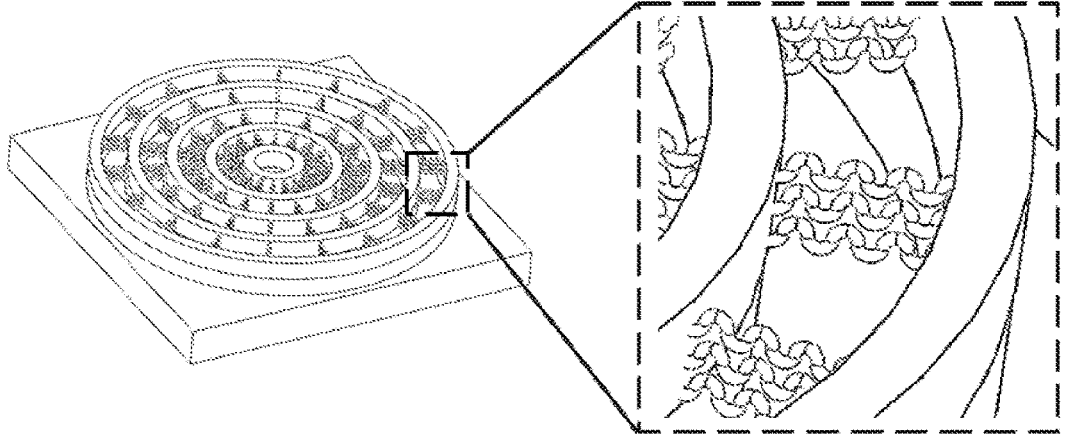
FIG. 22 is a schematic view of a structure combining a ring fin layer and an S-shaped curved column array provided by an embodiment of the disclosure.
Figure 23:
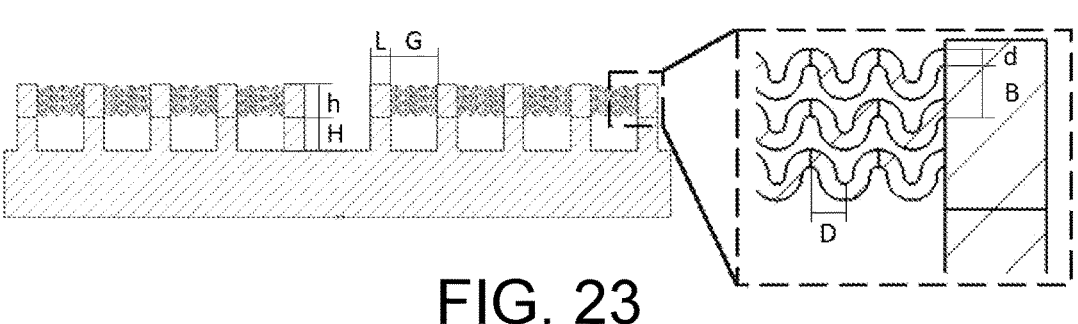
FIG. 23 is a side cross-sectional view of the structure combining the ring fin layer and the S-shaped curved column array provided by an embodiment of the disclosure.
Figure 24:
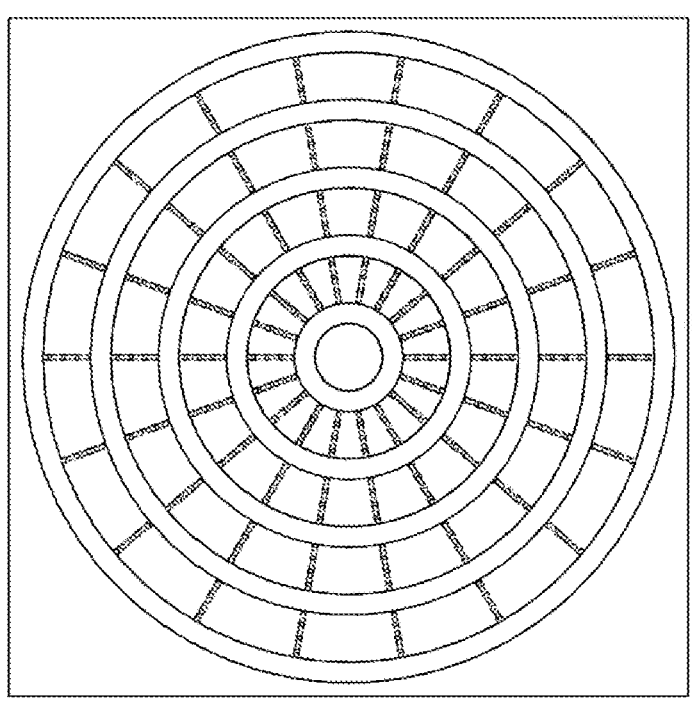
FIG. 24 is a top view of the structure combining the ring fin layer and the S-shaped curved column array provided by an embodiment of the disclosure.

As shown in FIG. 22 to FIG. 24, FIG. 22 is a schematic view of a structure combining a ring fin layer and an S-shaped curved column array provided by an embodiment of the disclosure, FIG. 23 is a side cross-sectional view of the structure combining the ring fin layer and the S-shaped curved column array provided by an embodiment of the disclosure, and FIG. 24 is a top view of the structure combining the ring fin layer and the S-shaped curved column array provided by an embodiment of the disclosure. In the structure combining the ring fin and the S-shaped curved-column circle array, a lower ring structure is prepared by machining. A ring width of the ring fin ranges from 0.1 to 1 mm, a ring spacing ranges from 0.3 to 2 mm, and a height ranges from 0.3 to 2 mm. In an embodiment, a ring width L=0.3 mm, a ring gap G=0.7 mm, and a height H=0.5 mm. A ring and the S-shaped curved column array on a top portion of the fin are prepared by the 3D printing-assisted multi-scale metal three-dimensional surface structure preparation method provided in the specification. A height of the ring is h=0.5 mm, the S-shaped curved column array is formed by three identical curved columns in a vertical direction, the S-shaped curved column array in a horizontal direction is evenly distributed around the center, and an angle between the two S-shaped curved columns is 20°. The S-shaped curved column is formed by a plurality of ¼ rings each with a diameter ranges from 30 to 200 μm, a diameter of the S-shaped curved column ranges from 30 to 100 μm, and a spacing of the S-shaped curved column ranges from 100 to 300 μm. In an embodiment, the S-shaped curved column is formed by a plurality of ¼ rings each with a D=100 μm, a diameter d of the S-shaped curved column=50 μm, and a spacing B of the S-shaped curved column=150 μm. The abovementioned structure combining the ring fin and the S-shaped curved-column circle array may be suitable for a spray cooling experiment.

Figure 25:
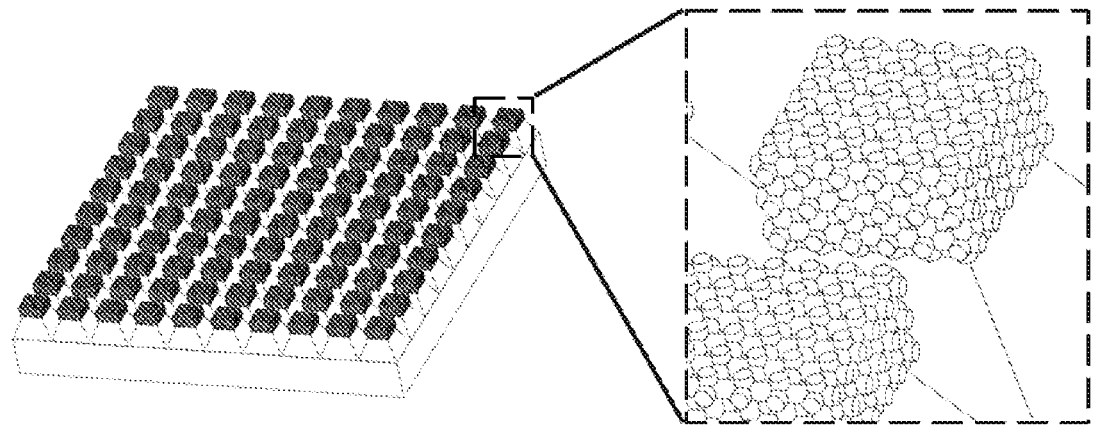
FIG. 25 is a schematic view of a structure combining a square trapezoidal terrace and a porous cubic column array provided by an embodiment of the disclosure.
Figure 26:
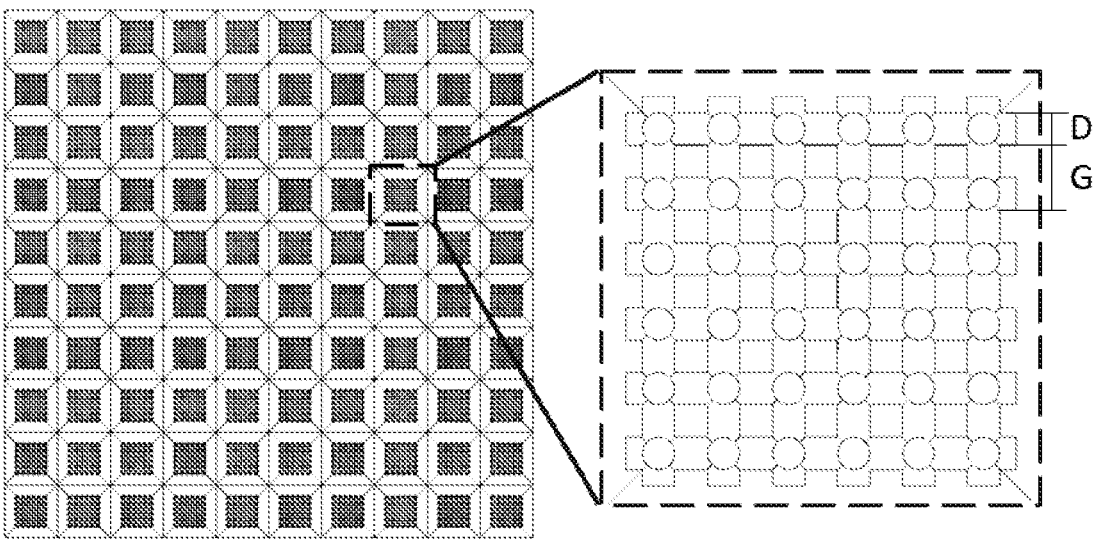
FIG. 26 is a top view of the structure combining the square trapezoidal terrace and the porous cubic column array provided by an embodiment of the disclosure.
Figure 27:
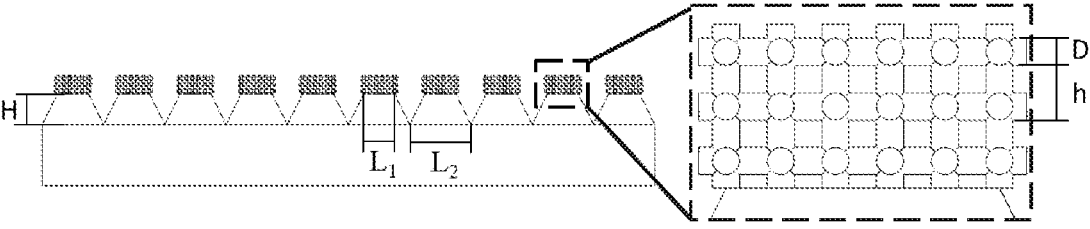
FIG. 27 is a side view of the structure combining the square trapezoidal terrace and the porous cubic column array provided by an embodiment of the disclosure.

As shown in FIG. 25 to FIG. 27, FIG. 25 is a schematic view of a structure combining a square trapezoidal terrace and a porous cubic column array provided by an embodiment of the disclosure, FIG. 26 is a top view of the structure combining the square trapezoidal terrace and the porous cubic column array provided by an embodiment of the disclosure, and FIG. 27 is a side view of the structure combining the square trapezoidal terrace and the porous cubic column array provided by an embodiment of the disclosure. In the structure combining the square trapezoidal terrace and the porous cubic column array, a lower square trapezoidal terrace structure is prepared by machining. A trapezoidal terrace upper side length of the square trapezoidal terrace ranges from 0.2 to 2 mm, a trapezoidal terrace lower side length ranges from 0.5 to 4 mm, and a height ranges from 0.2 to 1 mm. In an embodiment, a trapezoidal terrace upper side length L=0.5 mm, a trapezoidal terrace lower side length G=1 mm, and a height H=0.5 mm. The porous cubic column array on the square trapezoidal terrace is prepared by the 3D printing-assisted multi-scale metal three-dimensional surface structure preparation method provided by the disclosure, and the porous cubic column is only prepared on the upper surface of the trapezoidal terrace. The porous cubic column array is formed by a plurality of short straight columns each with a diameter ranges from 20-100 μm, and a distance between the straight columns ranges from 50 to 200 μm in the horizontal direction and ranges from 50 to 200 μm in the vertical direction. In an embodiment, the porous cubic column array is formed by a plurality of short straight columns each with a diameter D=50 μm, and a distance G=100 μm between the straight columns in the horizontal direction and a distance h=100 μm between the straight columns in the vertical direction. The abovementioned structure combining the square trapezoidal terrace and the porous cubic column array may be suitable for a boiling experiment.

On the other hand, the disclosure further provides a system, and the system is a heat exchange system and includes the metal component according to the above embodiments. For instance, the heat-dissipating metal component with the hexagonal mesh porous structure on the surface, the heat dissipating metal component with the trapezoidal dual-flow micro-channel structure on the surface, the heat dissipation device with the structure combining the straight fin and the straight column hole layer, the heat dissipating device with the structure combining the ring fin and the S-shaped curved column array, and the heat dissipating metal component with the structure d combining the square trapezoidal terrace and the porous cubic column array are included.

Finally, it is worth noting that the foregoing embodiments are merely described to illustrate the technical means of the disclosure and should not be construed as limitations of the disclosure. Even though the foregoing embodiments are referenced to provide detailed description of the disclosure, people having ordinary skill in the art should understand that various modifications and variations can be made to the technical means in the disclosed embodiments, or equivalent replacements may be made for part of the technical features; nevertheless, it is intended that the modifications, variations, and replacements shall not make the nature of the technical means to depart from the spirit and scope of the technical means of the embodiments of the disclosure.

What is claimed is:

1. A 3D printing-assisted multi-scale metal three-dimensional surface structure preparation method, comprising:
    preparing a micron-level three-dimensional structure mask through a 3D printing technology to improve precision of a metal structure, wherein the three-dimensional structure mask comprises a hollow portion and a body portion, and the hollow portion is matched with a three-dimensional structure model; and performing a material conversion on a metal matrix fixed with the three-dimensional structure mask and obtaining a target metal, wherein a surface of the target metal has a three-dimensional structure matched with the three-dimensional structure model, wherein a step of preparing a micro-level three-dimensional structure mask through the 3D printing technology comprises:

a three-dimensional structural model is analyzed and processed to obtain a laser scanning sequence; and according to the laser scanning sequence, the three-dimensional structure mask is prepared through a laser direct writing 3D printing technology.

2. The 3D printing-assisted multi-scale metal three-dimensional surface structure preparation method according to claim 1, further comprising:

machining the metal matrix before the material conversion is performed on the metal matrix fixed with the three-dimensional structure mask.

3. The 3D printing-assisted multi-scale metal three-dimensional surface structure preparation method according to claim 1, wherein the performing the material conversion on the metal matrix fixed with the three-dimensional structure mask and obtaining the target metal comprises:

fixing the three-dimensional structure mask on a surface of the metal matrix to form a template matrix assembly, wherein the hollow portion in the three-dimensional structure mask is directly connected to the metal matrix;

performing material conversion on the template matrix assembly to obtain a metal body; and removing the three-dimensional structure mask on the metal body to obtain the target metal.

4. The 3D printing-assisted multi-scale metal three-dimensional surface structure preparation method according to claim 3, wherein the removing the three-dimensional structure mask on the metal body to obtain the target metal comprises:

immersing the metal body in a removal resin solution to remove the three-dimensional structure mask and to obtain the target metal, wherein the removal resin solution is capable of dissolving a photosensitive resin material corresponding to the three-dimensional structure mask and does not react with a metal material corresponding to the target metal.

5. The 3D printing-assisted multi-scale metal three-dimensional surface structure preparation method according to claim 1, wherein a conversion method for the material conversion performed on the metal matrix fixed with the three-dimensional structure mask is selected from a group comprising an electroplating method, a chemical plating method, and a chemical vapor deposition method.

6. The 3D printing-assisted multi-scale metal three-dimensional surface structure preparation method according to claim 5, wherein the performing the material conversion on the template matrix assembly to obtain the metal body by adopting the electroplating method comprises:

immersing the template matrix assembly in a material conversion solution and connecting a working electrode;

immersing an auxiliary electrode and a reference electrode in the material conversion solution; and controlling an electrochemical workstation to be turned on for a predetermined time period and then obtaining the metal body.

7. The 3D printing-assisted multi-scale metal three-dimensional surface structure preparation method according to claim 1, comprising following steps before the material conversion is performed on the metal matrix fixed with the three-dimensional structure mask to obtain the target metal:

polishing the surface of the metal matrix; and cleaning the polished surface of the metal matrix by using a cleaning reagent.

* * * * *